(12) United States Patent  
Miyake (10) Patent No.: US 6,367,532 B1  
(45) Date of Patent: Apr. 9, 2002

(54) LAMINATOR

(75) Inventor: Ken Miyake, Amagasaki (JP)

(73) Assignee: Sanei Giken Co., Ltd., Hyogo (JP)

( * ) Notice: Subject to any disclaimer, the term of this patent is extended or adjusted under 35 U.S.C. 154(b) by 0 days.

(21) Appl. No.: 09/438,977

(22) Filed: Nov. 12, 1999

(30) Foreign Application Priority Data

Feb. 18, 1999 (JP) ............................................. 11-039780
Nov. 5, 1999 (JP) ............................................. 11-314591

(51) Int. Cl.⁷ ............................................. B32B 31/18
(52) U.S. Cl. ....................... 156/497; 156/521; 156/522; 156/552; 156/555
(58) Field of Search ................................ 156/497, 538, 156/542, 543, 552, 555, 582, 521, 522

(56) References Cited

U.S. PATENT DOCUMENTS 4,585,509 A * 4/1986 Obayashi ..................... 156/497
4,840,698 A    6/1989 Kuehnert ..................... 156/485
4,909,890 A    3/1990 Bonnyman ..................... 156/494
4,909,891 A * 3/1990 Sumi et al. .................. 156/497
4,964,937 A * 10/1990 Seki ........................... 156/250
5,720,847 A * 2/1998 Nagate et al. ............... 156/497

FOREIGN PATENT DOCUMENTS

| DE | 33 34 009 A1 | 5/1985 |
| EP | 0 125 584 A2 | 11/1984 |
| EP | 0 163 315 A2 | 12/1985 |
| EP | 0 360 269 A2 | 3/1990 |
| EP | 0 460 621 A1 | 12/1991 |
| JP | 60-85927 | 5/1985 |

* cited by examiner

Primary Examiner—James Sells  
(74) Attorney, Agent, or Firm—McDermott, Will & Emery (57) ABSTRACT

In the film holder of a laminator, film sucking bores are arranged so that pitch P2 in the Y direction and pitch P1 in the X direction become gradually smaller toward laminate roll. Therefore, the laminator capable of stably performing the laminating operation even in laminating the rear end of a film sheet can be provided.

11 Claims, 10 Drawing Sheets

FIG.17 PRIOR ART

LAMINATOR

BACKGROUND OF THE INVENTION

1. Field of the Invention

The present invention relates to a laminator, and more particularly to an improvement in the structure of a film holding member which is provided near a laminate roll to laminate a film on a plate.

2. Description of the Background Art

A laminator disclosed in Japanese Patent Laying-Open No. 60-85927 is typical of laminators which employ the auto-cutting method whereby a photosensitive resist film (hereinafter, referred to as a film), for example, is successively laminated on (applied to) a plate by using a pair of laminate rolls (pressure rolls).

The schematic structure and operation of the laminator disclosed in Japanese Patent Laying-Open No. 60-85927 will be described with reference to FIGS. 13 to 15. The laminator structure disclosed in the gazette is capable of laminating a film on both sides of a plate. Since the plate structure is basically identical on the upper and lower surfaces, laminating a film on the upper surface of the plate will only be described.

Main Structure of Laminator

In the following, the main structure of the laminator will be described with reference to FIGS. 13 to 15. The laminator which employs the auto-cutting method includes, as its main components, a pair of laminate rolls (pressure rolls) 2, 2, a film holding member 5, tacking members 1, 1, a film cutter 3 (shown in FIGS. 14 and 15), and a cutter backup 4. There is also a film 6 provided upward in the form of a film roll (not shown).

Here, film 6 means a dry photo-resist film (DRF). The dry photoresist film (DRF) has the three-layer structure of a base film, a photo-resist film, and a cover film when it is wound around the film roll. In laminating the dry photo-resist film on a plate 7 described below, only the cover film is removed and the photo-resist film plane is applied to plate 7.

Tacking members 1, 1, cutter backup 4, and film holding member 5 are connected to a negative pressure supplying apparatus (not shown). Film sucking bores 10 which can be supplied with negative pressure are provided in such contact surfaces of tacking members 1, 1, cutter backup 4, and film holding member 5 that are in contact with film 6. By properly applying negative pressure to film sucking bores 10 using the negative pressure supplying apparatus, film 6 is sucked and held as necessary.

Film cutter 3 has a rotary circular blade, and cuts film 6 by moving in the width direction of cutter backup 4 (in the direction perpendicular to the sheet) while rotating the rotary circular blade.

Operation of Laminator

In the following, the operation of laminating film 6 on a plate 7 by the laminator will be described with reference to FIGS. 13 to 15.

Here, plate 7 is used for a glass plate which is used for a printed wiring board, a flat display, and so on.

Figure 13:
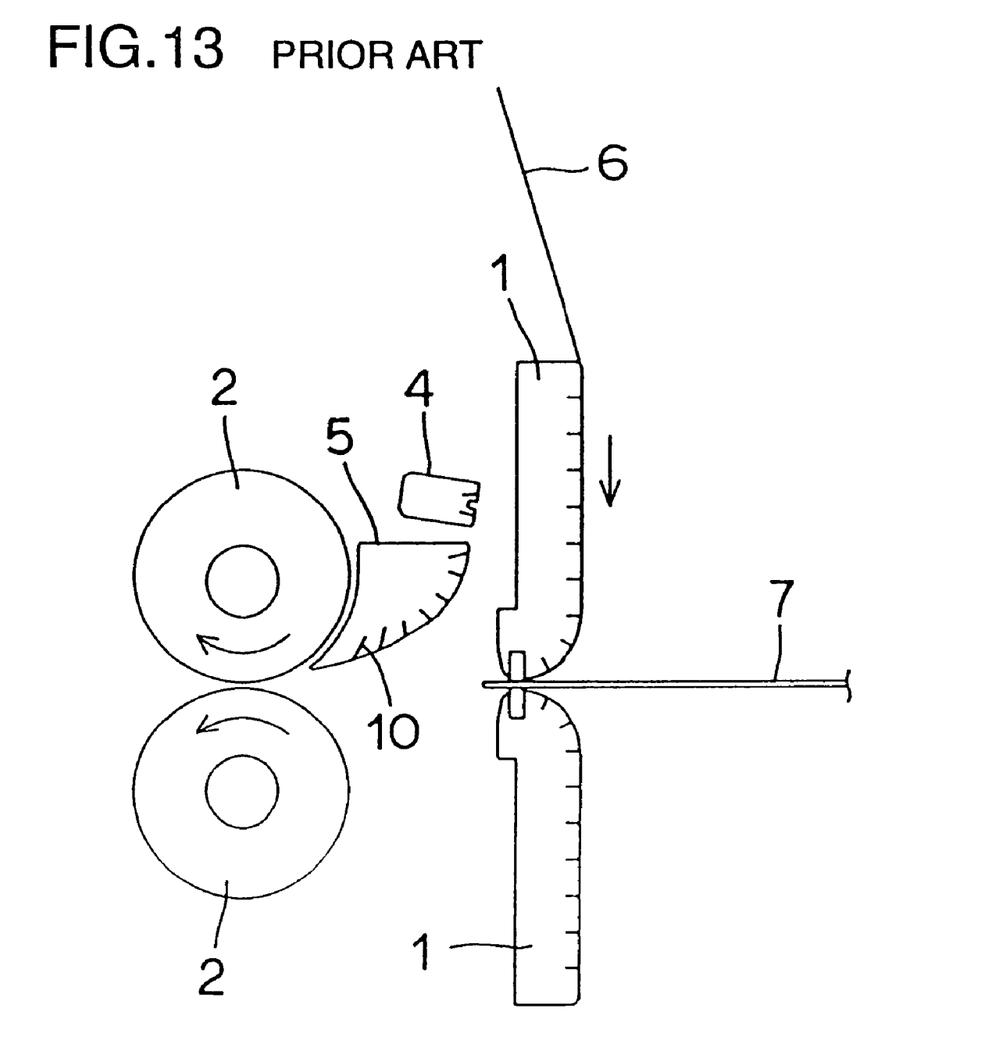
FIG. 13 is a first side view for illustrating the schematic structure and the operation principle of a prior art laminator.

Referring to FIG. 13, the front end of film 6 which is drawn out from the film roll is first brought toward the front end of plate 7 while it is sucked and held by tacking member 1 which is supplied with negative pressure. Thereafter, the front end of film 6 is pressed against the front end of plate 7 for a while by tacking member 1. Thus, tacking of the front end of film 6 on the front end of plate 7 is completed. Film 6 is tacked on plate 7 such as by pressure and heating.

Figure 14:
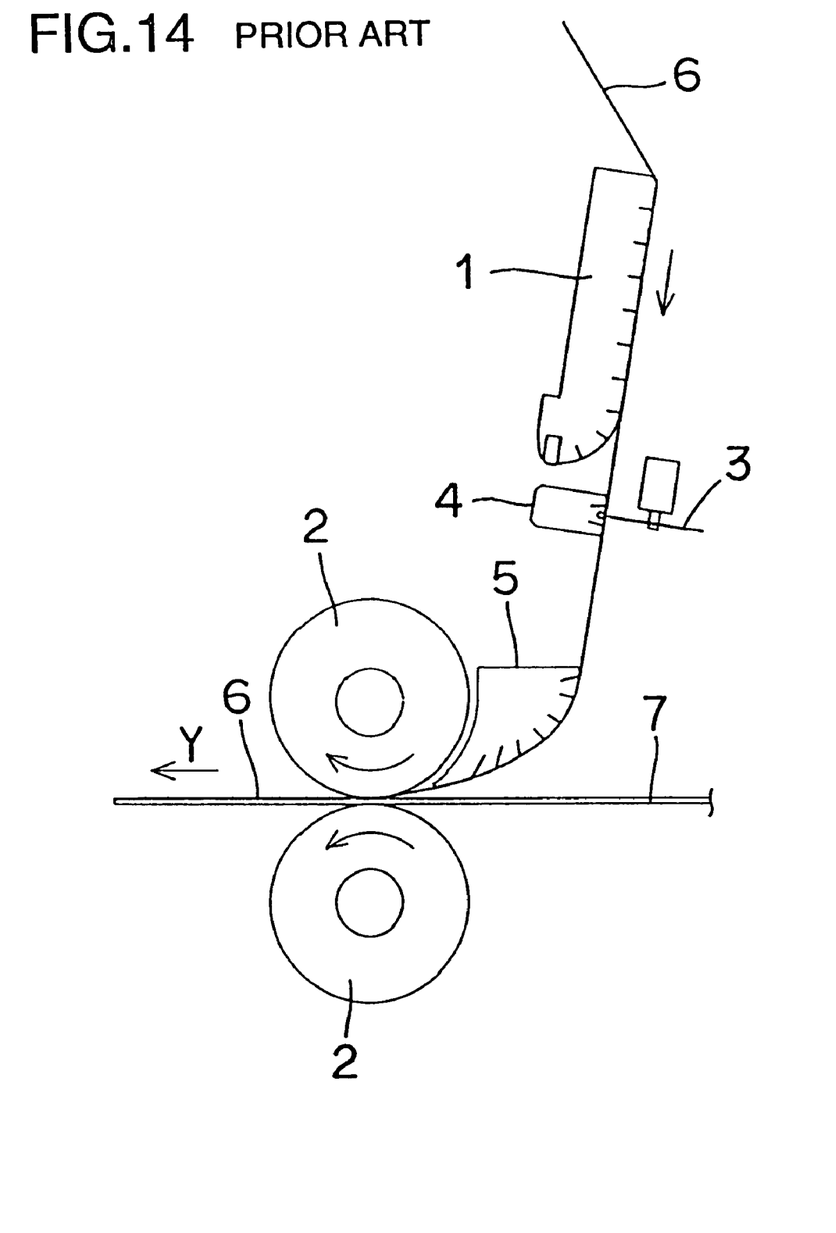
FIG. 14 is a second side view for illustrating the schematic structure and the operation principle of the prior art laminator.

Referring to FIG. 14, after tacking film 6 on plate 7, tacking member 1 stops sucking and holding film 6 and moves together with cutter backup 4 and film cutter 3 away from plate 7. Simultaneously with the operation, plate 7 on which the front end of film 6 has been tacked is transported in the direction of a pair of laminate rolls 2, 2 (in the direction of Y in the figure) by a transporting apparatus such as a roll conveyor, and directed between laminate rolls 2, 2.

Thereafter, plate 7 is sent in the direction of Y with rotation of laminate roll 2, and film 6 is sequentially laminated on plate 7 from the front end of plate 7. At this time, tacking member 1 and film holding member 5 guide film 6 to laminate roll 2 in contact with film 6.

Figure 15:
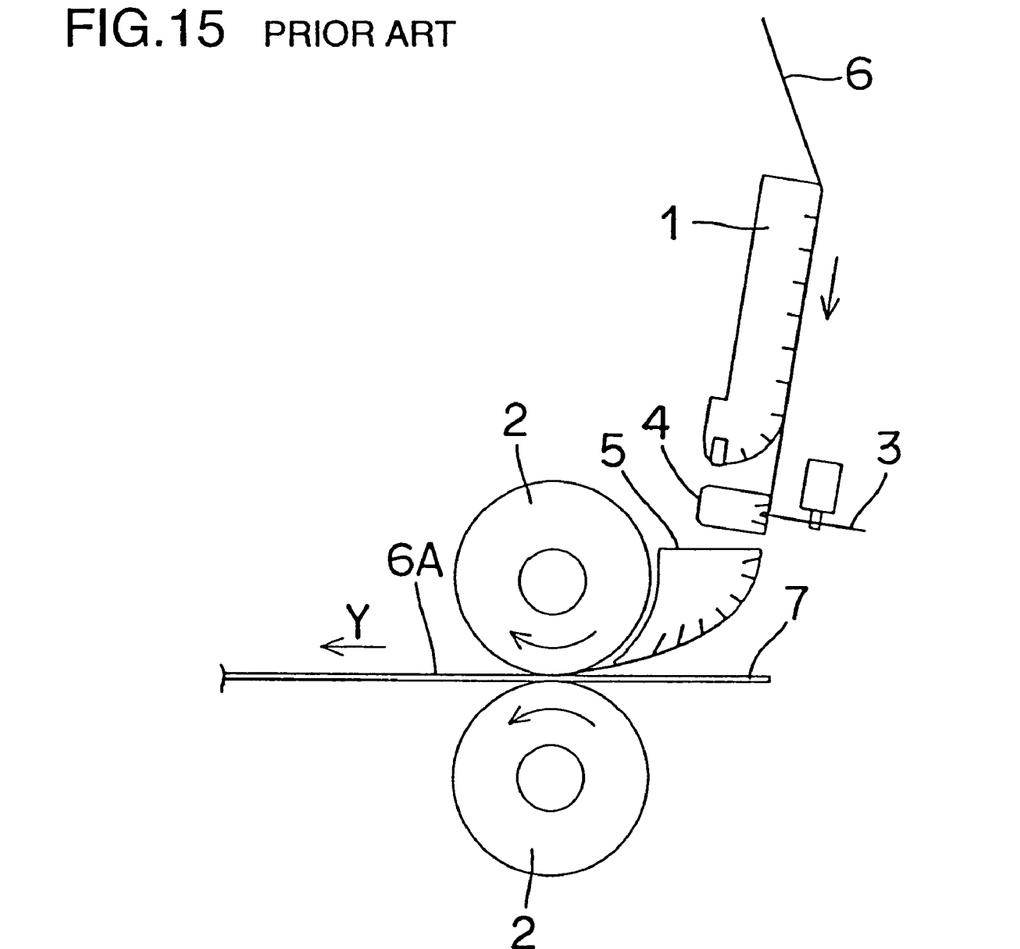
FIG. 15 is a third side view for illustrating the schematic structure and the operation principle of the prior art laminator.

Referring to FIG. 15, after laminating film 6 on plate 7 by a prescribed amount, tacking member 1, film cutter 3, and cutter backup 4 move at the same speed and in the same direction as film 6. In the meantime time, film cutter 3 moves in the width direction of cutter backup 4 while rotating, and cuts film 6 by the rotary blade. Thus, the rear end of film 6 is cut at right angle with respect to the sending direction of film 6, resulting in a film sheet 6A of a prescribed length.

The rear end of film sheet 6A is guided to laminate roll 2 while being sucked and held by film holding member 5 in which negative pressure is applied to film sucking bores 10. Thus, the rear end is laminated on plate 7.

In the laminator which has the above described structure and operation principle, sucking and holding of the rear end of film sheet 6A by film holding member 5 is important in evaluating the laminator performance.

Before cutting film 6, not only sucking and holding through negative pressure application to film holding member 5 but tensile force by the film roll or sucking and holding through negative pressure application to tacking member 1 gives sufficient tensile force to film 6, and thus film 6 is laminated on plate 7. In other words, film 6 is stably laminated on plate 7 without touching plate 7 before being guided to laminate roll 2.

After cutting film 6, however, tensile force is applied to the rear end of film sheet 6A only through sucking and holding by film holding member 5. The tensile force is generated by applying negative pressure to a plurality of film sucking bores 10 which are provided in such a surface of film holding member 5 that is in contact with the film.

Therefore, if film sucking bores 10 cannot be supplied with sufficient negative pressure, tensile force which is applied to film sheet 6A becomes insufficient, and the rear end of film sheet 6A comes in contact with plate 7 before being guided to laminate roll 2, thereby causing wrinkles and bubbles. Thus, stable laminating of film 6 on plate 7 cannot be implemented.

Figure 16:
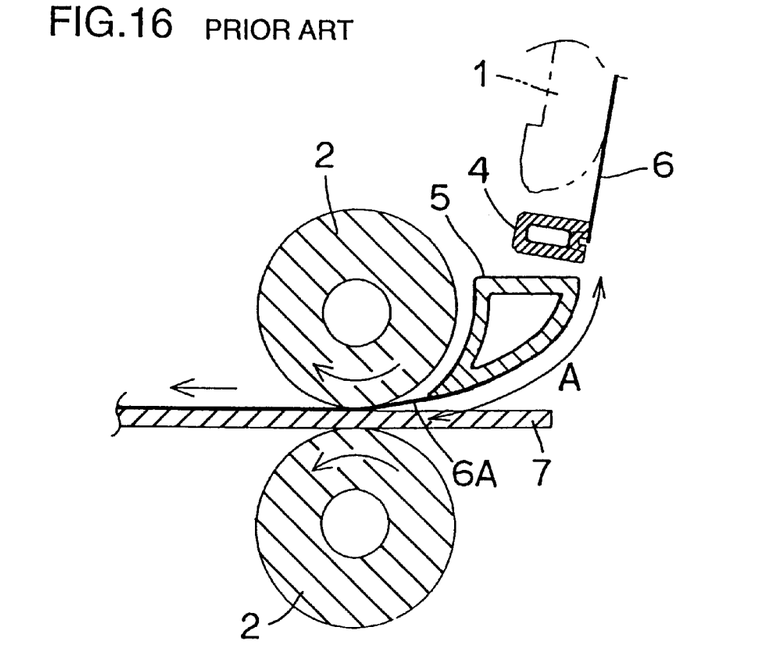
FIG. 16 is a sectional view for describing problems with the prior art laminator.
Figure 17:
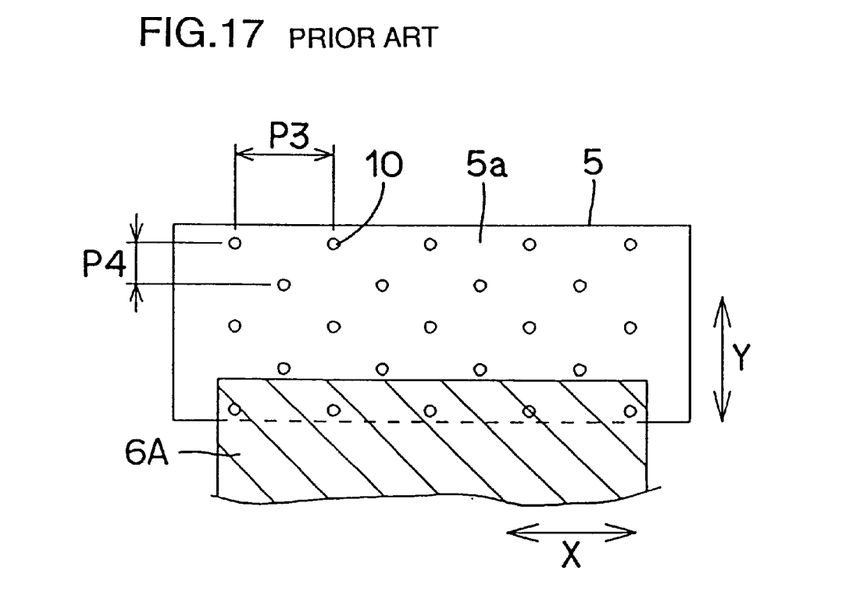
FIG. 17 is a front exploded view for describing problems with the prior art laminator.

FIGS. 16 and 17 show sectional and front exploded views of film holding member 5. Film holding member 5 has a plurality of film sucking bores 10 in the contact surface 5a which is in contact with film 6, which are arranged at regular intervals at pitch P4 parallel to the sending direction of film 6 (hereinafter, referred to as the Y direction) and at pitch P3 perpendicular to the sending direction of film 6 (hereinafter, referred to as the X direction). These film sucking bores 10 are connected to the negative pressure supplying apparatus and have a structure which can be supplied with negative pressure.

The rear end of film sheet 6A immediately after being cut by film cutter 3 is sucked and held by most film sucking bores 10 of film holding member 5. Therefore, the negative pressure applied to the film sucking bores 10 of film holding member 5 maintains sufficient pressure, and film sheet 6A is supplied with sufficient tensile force. As a result, film sheet 6A is stably laminated on plate 7 in this situation without coming in contact with plate 7 before being guided to laminate roll 2.

As shown in FIG. 17, however, as the laminating operation advances and the rear end of film sheet 6A is sent to laminate roll 2, the number of film sucking bores 10 of film holding member 5 which are opened without being covered with film sheet 6A gradually increases. Therefore, negative pressure applied to film holding member 5 decreases, which makes it impossible to apply sufficient tensile force to film sheet 6A.

As a result, before film sheet 6A is guided to laminate roll 2, film sheet 6A comes in contact with plate 7 and causes winkles and bubbles. Thus, film 6a cannot be stably laminated on plate 7 till the end of laminating.

Further, film sheet 6A is not held after it moves away from film holding member 5. In order not to bring film sheet 6A in contact with plate 7 before it is guided to laminate roll 2, the distance between a portion of laminate roll 2 for pressurizing film sheet 6A toward plate 7 and film holding member 5 is preferably as small as possible.

However, laminate roll 2 is generally provided to be able to move in the thickness direction of plate 7 for the pressurizing operation. If the above described structure is provided when plate 7 does not exist, therefore, downward movement of laminate roll 2 may cause laminate roll 2 to interfere with film holding member 5.

Therefore, film holding member 5 has to be provided in advance at such a location that does not cause interference of laminate roll 2 with film holding member 5, and film holding member 5 cannot be provided near laminate roll 2.

SUMMARY OF THE INVENTION

One object of the present invention is to provide a laminator capable of stably performing the laminating operation even in laminating the rear end of a film sheet.

Another object of the present invention is to provide a laminator capable of arranging a film holding member near a laminate roll during film application in order to stably perform the laminating operation.

In one aspect of the laminator according to the present invention, a laminator to apply a film to a plate includes a laminate roll to apply the film to the plate, and a film holding member arranged near the laminate roll to guide and hold the film till a point of time immediately before applying the film to a surface of the plate and having film sucking bores capable of being supplied with negative pressure in such a surface that is in contact with the film, the film sucking bores being arranged more densely near the laminate roll than in other regions.

In the laminator having the above described structure, the number of film sucking bores which are open is small even if the contact area decreases between the film and the contact surface of the film holding member. Thus, reduction in the negative pressure applied to the film holding member can be suppressed and the film holding member can have sufficient film sucking bores.

As a result, even in laminating the rear end of a film, the film holding member can maintain tensile force of at least a prescribed value for the film and the laminating operation can be stably performed.

In order to implement the present invention in a more preferable manner, the structure described below is employed. For example, the film sucking bores are arranged densely even in a region near a cutter backup which is provided in the laminator. For example, the film sucking bores are arranged to be gradually dense toward the laminate roll. Further, the film sucking bores are arranged densely near the laminate roll and sparsely in other portions.

In another aspect of the laminator according to the present invention, a laminator to apply a film to a plate includes a laminate roll to apply the film to the plate, and a film holding member arranged near the laminate roll to guide and hold the film till a point of time immediately before applying the film to a surface of the plate and having film sucking bores capable of being supplied with negative pressure in such a surface that is in contact with the film, the opening area of each of the film sucking bores being larger near the laminate roll than in other regions.

In the laminator having the above described structure, the opening area of opened film sucking bores is small even if the contact area decreases between a film and the contact surface of the film holding member. Thus, reduction in the negative pressure applied to the film holding member can be suppressed and the film holding portion can have a sufficient opening area of the film sucking bores.

As a result, even in laminating the rear end of a film, tensile force of at least a prescribed value is maintained for the film by the film holding member and the laminating operation can be stably performed.

In order to implement the present invention in a more preferable manner, the structure described below is employed. For example, the opening area of each of the film sucking bores becomes gradually larger toward the laminate roll. Further, the opening area of each of the film sucking bores is larger near the laminate roll and smaller in other portions.

In still another aspect of the laminator according to the present invention, a laminator to apply a film to a plate includes a laminate roll to apply the film to the plate, and a film holding member arranged near the laminate roll to guide and hold the film till a point of time immediately before applying the film to a surface of the plate and having a film sucking bore or groove capable of being supplied with negative pressure in such a surface that is in contact with the film, the surface in contact with the film being provided with a groove extending across a direction for sending the plate.

In the laminator having the above described structure, physical resistance force increases for the film. As a result, during the laminating operation of a film, high tensile force is applied even for the same negative pressure and the same sucking bore arrangement and the laminating operation can be stably performed.

In order to implement the present invention in a more preferable manner, the groove is provided to include the film sucking bore.

In yet another aspect of the laminator according to the present invention, a laminator to apply a film to a plate includes a laminate roll to apply the film to the plate, and a film holding member arranged near the laminate roll to guide and hold the film till a point of time immediately before applying the film to a surface of the plate and having groove-like openings capable of being supplied with negative pressure in such a surface that is in contact with the film and extending across a direction for sending the plate.

In the laminator having the above described structure, even if the contact area decreases between the rear end of a film and the contact surface of the film holding member, provision of the groove-like openings extending across the sending direction of the plate can increase the opening area for film suction in the region. In laminating the rear end of a film, high tensile force is maintained even in the case of the same negative pressure and the laminating operation can be stably performed.

In a further aspect of the laminator according to the present invention, a laminator to apply a film to a plate includes a laminate roll to apply the film to the plate, and a film holding member arranged near the laminate roll to guide and hold the film till a point of time immediately before applying the film to a surface of the plate and having film sucking bores capable of being supplied with negative pressure in such a surface that is in contact with the film, the film sucking bores each including a first sucking bore and a second sucking bore which is provided coaxially with and has a larger bore diameter than the first sucking bore, and the second sucking bore being provided on the side of a surface that is in contact with the film.

In the laminator having the above described structure, the substantial opening area of the film sucking bores are increased. As a result, in laminating a film, high tensile force is maintained even in the case of the same negative pressure and the laminating operation can be stably performed.

In a further aspect of the laminator according to the present invention, a laminator to apply a film to a plate includes a laminate roll to apply the film to the plate, and a film holding member arranged near the laminate roll to guide and hold the film till a point of time immediately before applying the film to a surface of the plate and having film sucking bores or grooves capable of being supplied with negative pressure in such a surface that is in contact with the film and a disengaging apparatus for disengagement from the laminate roll with motion of the laminate roll.

In the laminator having the above described structure, the film holding member can be arranged nearer to the laminate roll when applying a film to the plate compared with a conventional laminator having a fixed film holding member. Therefore, the film can be sucked and held nearer to the laminate roll position, and thus the film can be stably laminated on the plate till the end of laminating.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 8A to 8C show the shapes of a film sucking bore provided in film holding member 5 of the laminator in the sixth embodiment, in which FIG. 8A is a plan view, FIGS. 8B and 8C are sectional views along line X–X' in FIG. 8A.

DESCRIPTION OF THE PREFERRED EMBODIMENTS

In the following, laminators in the embodiments according to the present invention will be described with reference to the drawings. The feature of the laminators in the embodiments according to the present invention is a film holding member 5. Laminate rolls (pressure rolls) 2, 2, a pair of tacking members 1, 1, a film cutter 3, and a cutter backup 4 as other main components are similar to the conventional laminator, and description thereof will not be provided. The same parts as the conventional structure are denoted by the same reference characters.

First Embodiment

Figure 1:
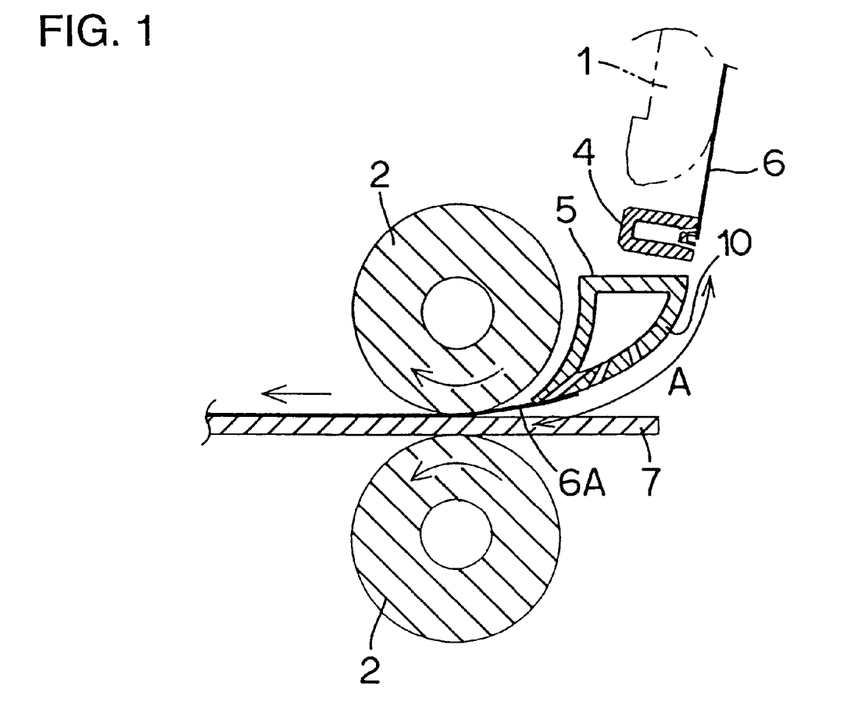
FIG. 1 is a sectional view in the vicinity of a film holding member 5 of a laminator in a first embodiment.

A laminator in a first embodiment will be described with reference to FIGS. 1 and 2.

A film holding member 5 of the laminator in this embodiment includes a plurality of film sucking bores 10, to which negative pressure is applied similarly to the conventional laminator, provided in a contact surface 5a which is in contact with a film sheet 6A.

Figure 2:
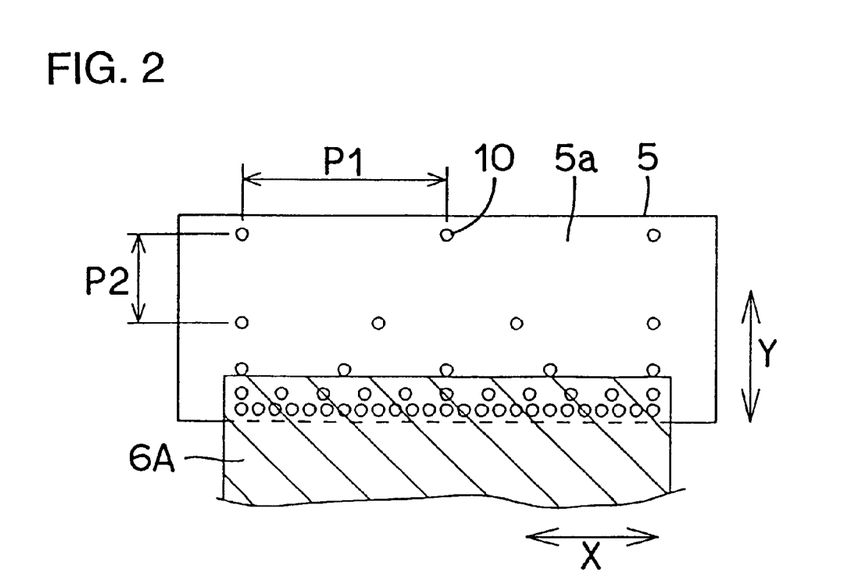
FIG. 2 is a front exploded view of film holding member 5 of the laminator in the first embodiment.

As shown in FIG. 2, film sucking bores 10 are provided so that pitch P2 in the Y direction and pitch P1 in the X direction become successively smaller toward laminate roll 2.

Even if the contact area of film sheet 6A and the contact surface of film holding member 5 becomes small, therefore, the number of opened film sucking bores 10 is small. Therefore, reduction in the negative pressure applied to film holding member 5 can be suppressed and the film holding portion can have sufficient film sucking bores 10.

As a result, even in laminating the rear end of film sheet 6A, tensile force of at least a prescribed value is maintained for film sheet 6A by film holding member 5 and the laminating operation can be stably performed.

The arrangement of film sucking bores 10 can attain similar functions and effects even by providing one of pitch P2 in the Y direction and pitch P1 in the X direction to be successively smaller toward laminate roll 2.

Second Embodiment

Figure 3:
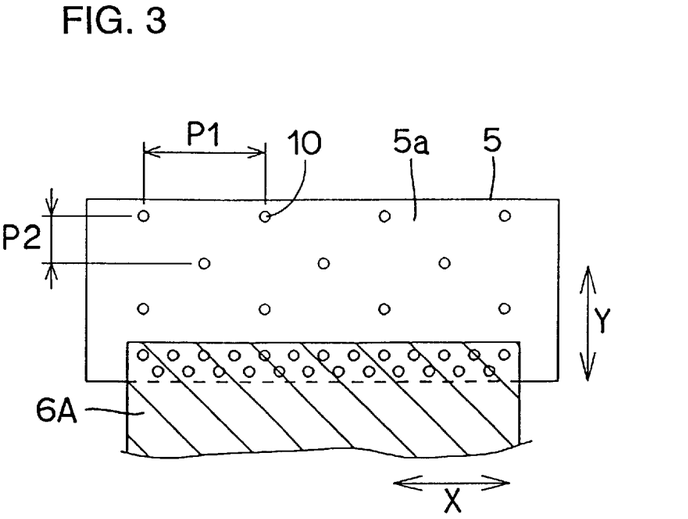
FIG. 3 is a front exploded view of film holding member 5 of a laminator in a second embodiment.

In the following, a laminator in a second embodiment will be described with reference to FIG. 3.

Film sucking bores 10 which are provided in film holding member 5 of the laminator in this embodiment are provided so that pitch P2 in the Y direction and pitch P1 in the X direction become small for at least one bore line which includes the bore line closest to laminate roll 2.

In this arrangement, the number of opened film sucking bores 10 is also small as in the case of the first embodiment even if the contact area of film sheet 6a and the contact surface of film holding member 5 is small. Therefore, reduction in the negative pressure applied to film holding member 5 can be suppressed and the film holding portion can have sufficient film sucking bores 10.

As a result, even in laminating the rear end of film sheet 6A, tensile force of at least a prescribed value is maintained for film sheet 6a by film holding member 5 and the laminating operation can be stably performed.

The arrangement of film sucking bores 10 can attain similar functions and effects even by providing one of pitch P2 in the Y direction and pitch P1 in the X direction to be small for at least one bore line which includes the bore line closest to laminate roll 2.

Third Embodiment

Figure 4:
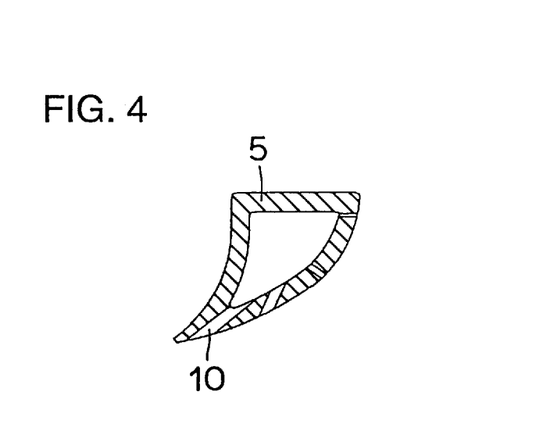
FIG. 4 is a sectional view of film holding member 5 of a laminator in a third embodiment.

In the following, a laminator in a third embodiment will be described with reference to FIG. 4.

Film sucking bores 10 which are provided in film holding member 5 of the laminator in this embodiment are provided so that the opening area becomes successively larger toward laminate roll 2.

Even if the contact area of film sheet 6A and the contact surface of film holding member 5 is small, therefore, the opening area of opened film sucking bores 10 is small. Therefore, reduction in the negative pressure applied to film holding member 5 can be suppressed and the film holding portion can have a sufficient opening area of film sucking bores 10.

As a result, even in laminating the rear end of film sheet 6A, tensile force of at least a prescribed value is maintained for film sheet 6A by film holding member 5 and the laminating operation can be stably performed.

Fourth Embodiment

Figure 5:
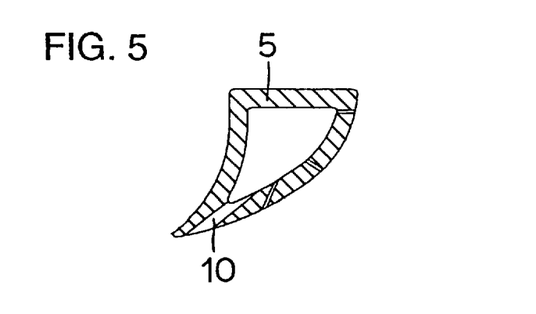
FIG. 5 is a sectional view of film holding member 5 of a laminator in a fourth embodiment.

In the following, a laminator in a fourth embodiment will be described with reference to FIG. 5.

At least one line of film sucking bores 10, which are provided in film holding member 5 of the laminator in this embodiment, that is closest to laminate roll 2 each have their sectional area larger than that of other film sucking bores 10.

By employing this structure, the opening area of opened film sucking bores 10 is small as in the case of the third embodiment even if the contact area of film sheet 6A and the contact surface of film holding member 5 is small. Therefore, reduction in the negative pressure applied to film holding member 5 can be suppressed and the film holding portion can have a sufficient opening area of film sucking bores 10.

As a result, even in laminating the rear end of film sheet 6A, tensile force of at least a prescribed value is maintained for film sheet 6A by film holding member 5 and the laminating operation can be stably performed.

It is noted that not only bores in one line closest to laminate roll 2 but those in a plurality of lines may each have a larger sectional area than others.

Fifth Embodiment

Figure 6:
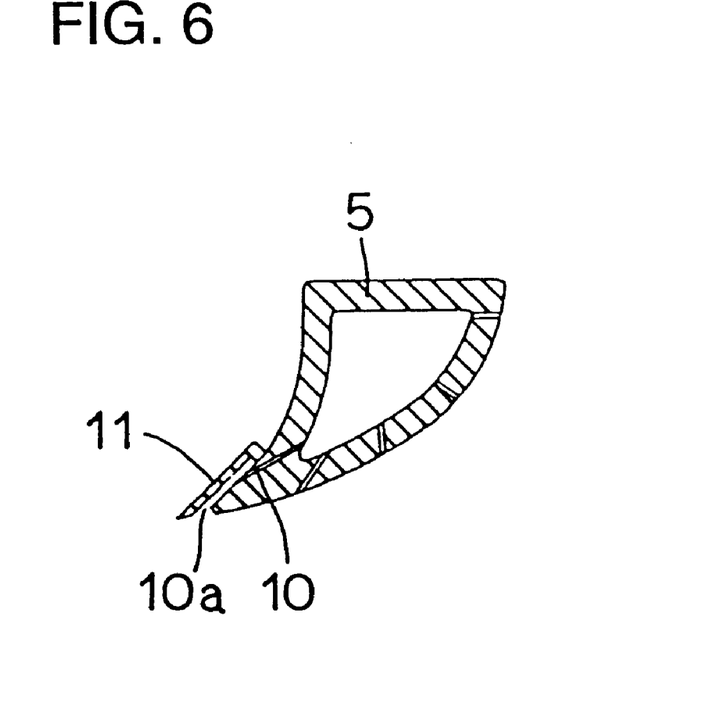
FIG. 6 is a sectional view of film holding member 5 of a laminator in a fifth embodiment.

In the following, a laminator in a fifth embodiment will be described with reference to FIG. 6.

Contact surface 5a of film holding member 5 of the laminator in this embodiment is provided with at least one groove 10a which is supplied with negative pressure by providing a guide 11 which extends in the X direction in the vicinity of a portion closest to laminate roll 2.

By thus providing groove 10a, the opening area for film suction can be increased in this region even if the contact area decreases between the rear end of film sheet 6A and contact surface 5a of film holding member 5.

As a result, in laminating film sheet 6A, high tensile force is maintained even in the case of the same negative pressure and the laminating operation can be stably performed.

It is noted that not only one line but multiple lines of grooves 10a may be provided. Although guide 11 is provided in the structure shown in FIG. 6, groove 10a may be provided directly in contact surface 5a.

Sixth Embodiment

Figure 7:
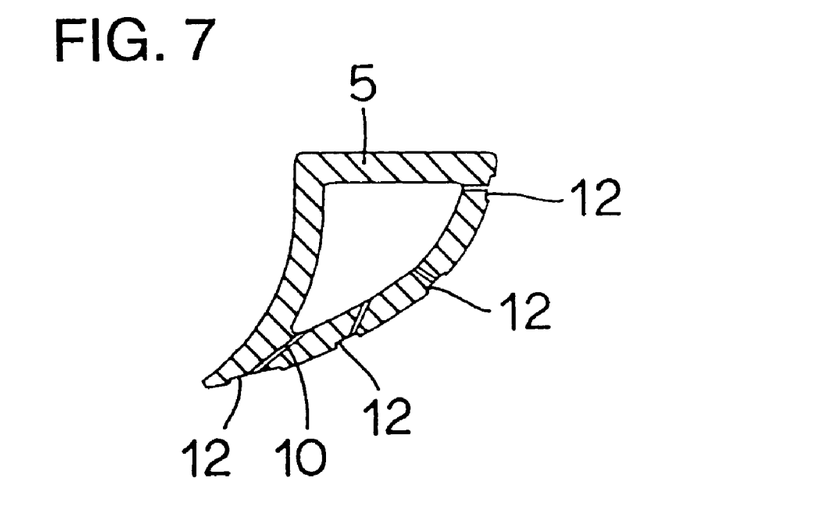
FIG. 7 is a sectional view of film holding member 5 of a laminator in a sixth embodiment.

In the following, a laminator in a sixth embodiment will be described with reference to FIG. 7.

Contact surface 5a of film holding member 5 of the laminator in this embodiment is provided with a groove 12 to extend in the X direction and include film sucking bore 10.

By thus providing groove 12, the substantial opening area of film sucking bore 10 can be made larger and physical resistance force to film sheet 6A can be increased. Even in the case of the same negative pressure, therefore, high tensile force is maintained. Thus, the laminating operation can be stably performed.

As a result, in laminating a film, tensile force of at least a prescribed value is maintained for the film by the film holding portion and the laminating operation can be stably performed.

Figure 8A:
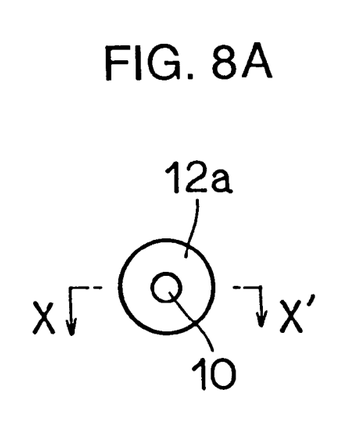
Figure 8B:
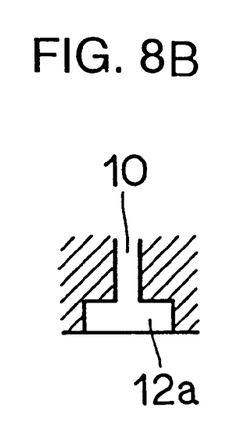
Figure 8C:
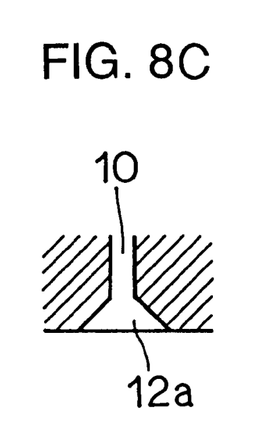

In stead of groove 12, film sucking bore 10 may be formed of a first sucking bore 10 and a second sucking bore 12a which is provided coaxially with and has a larger bore diameter than first sucking bore 10 as shown in FIGS. 8A to 8C. Second sucking bore 12a is provided on the side of the contact surface with film sheet 6A. Thus, the substantial opening area for film suction can be made larger.

Figure 9:
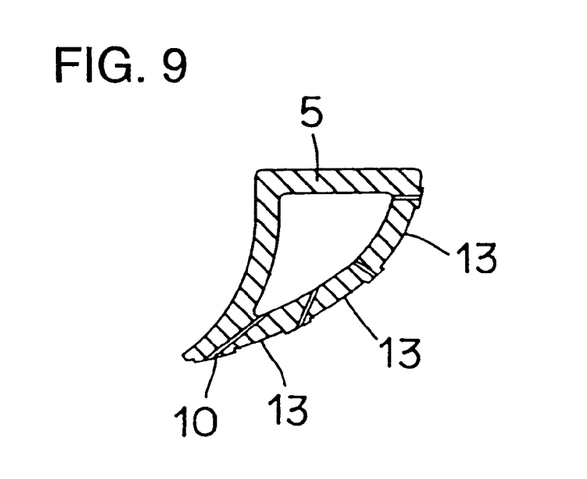
FIG. 9 is a sectional view of another form of film holding member 5 of the laminator in the sixth embodiment.

In order to increase physical resistance force to film sheet 6A, a groove 13 may be provided between film sucking bores 10 as shown in FIG. 9.

Further, the structures of film holding members 5 disclosed in the above described embodiments can be combined if necessary.

Seventh Embodiment

In the following, a laminator in a seventh embodiment will be described with reference to FIGS. 10 and 11.

Film holding member 5 and laminate roll 2 of the laminator in this embodiment are provided with a disengaging apparatus for applying rotational movement so that film holding member 5 is disengaged from laminate roll 2 with motion of laminate roll 2.

For the disengaging apparatus, film holding member 5 is attached rotatably about the rotation center 50 of the holding member. Film holding member 5 has a fixed L-shaped arm 51 which includes a roller 52.

Laminate roll 2 is attached to a roll holding member 21 to be able to rotate about the rotation center 20 of the holding member. The lower end of roll holding member 21 is provided with an abutting surface 21a for abutting against roller 52.

Figure 10:
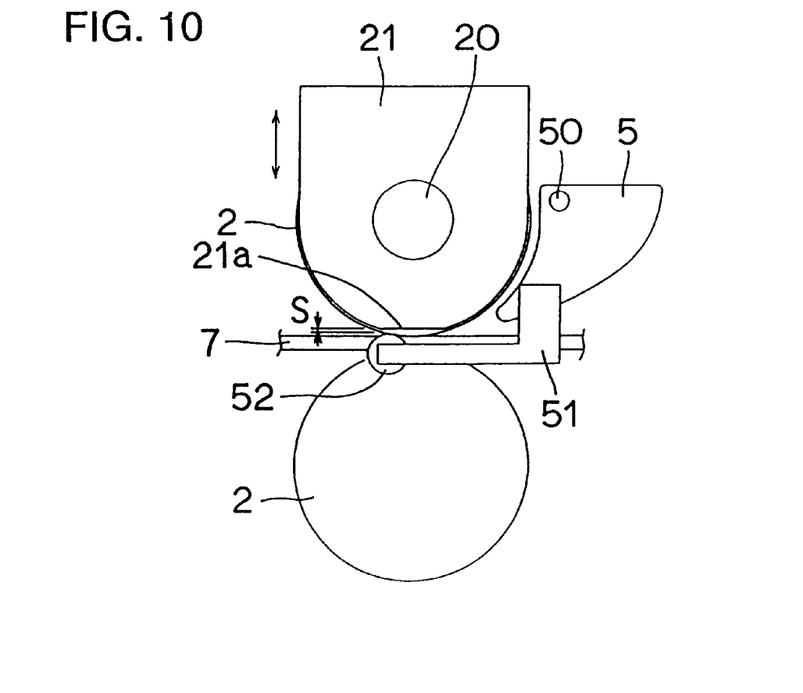
FIG. 10 is a first side view showing a structure of film holding member 5 of a laminator in a seventh embodiment.

In the laminator which includes the disengaging apparatus having the above structure, when film 6 is laminated on plate 7, a space (S) is provided between abutting surface 2a and roller 52 in the normal position of film holding member 5 as shown in FIG. 10.

Figure 11:
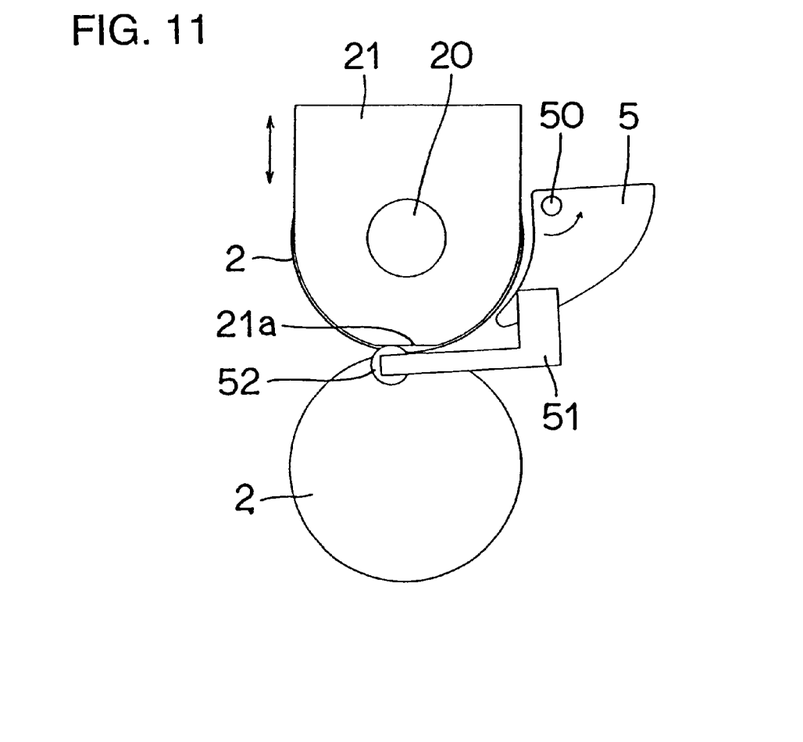
FIG. 11 is a second side view showing a structure of film holding member 5 of the laminator in the seventh embodiment.

When plate 7 does not exist, upper laminate roll 2 abuts against lower laminate roll 2 as shown in FIG. 11. At this time, abutting surface 21a moves roller 52 downward while abutting against it. Thus, film holding member 5 rotates counterclockwise about rotation center 50 of the holding member. As a result, film holding member 5 is disengaged from laminate roll 2, thereby preventing interference between film holding member 5 and laminate roll 2.

As described above, the film holding member can be placed nearer to the laminate roll when applying a film to a plate in this embodiment than in a conventional laminator which has a fixed film holding member. Therefore, the film can be stably laminated on the plate till the end of laminating without causing winkles and bubbles between the film and the plate.

Another Embodiment

In the above described embodiments, the arrangement and shape of the film sucking bores and the like near the laminate roll have been described to prevent occurrence of wrinkles and bubbles between a film and a plate when applying the film to the plate. In order to hold the film using the film holding member, however, the arrangement and shape of the film sucking bores near a cutter backup are also important.

Figure 12:
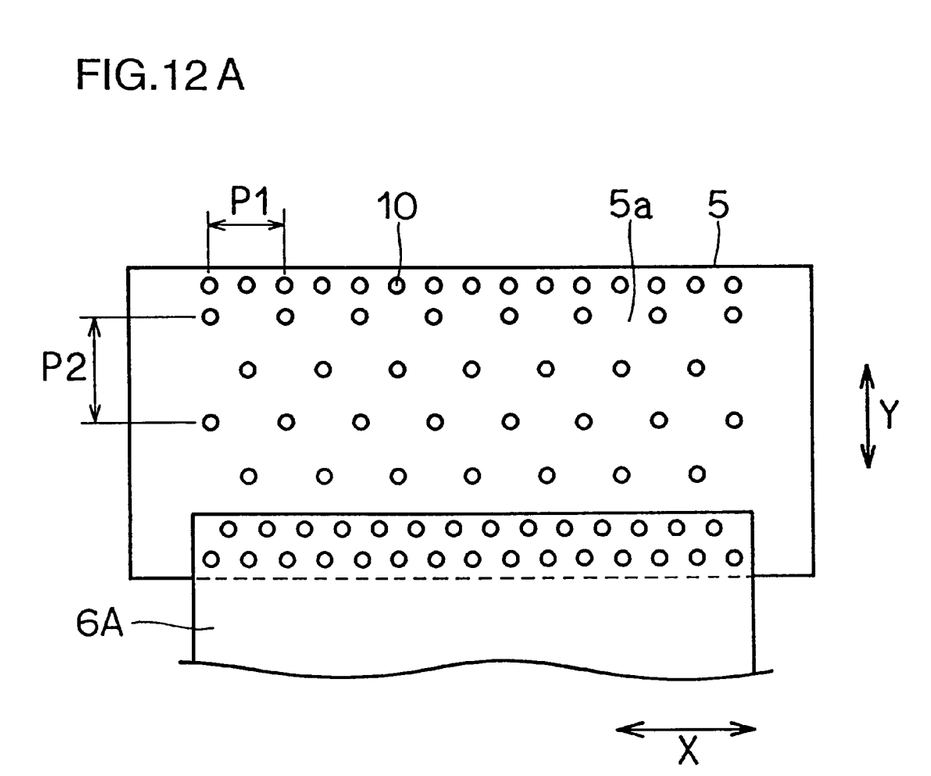
FIGS. 12A and 12B are a front exploded view and a sectional view for illustrating a structure of film holding member 5 in another embodiment.
Figure 12B:
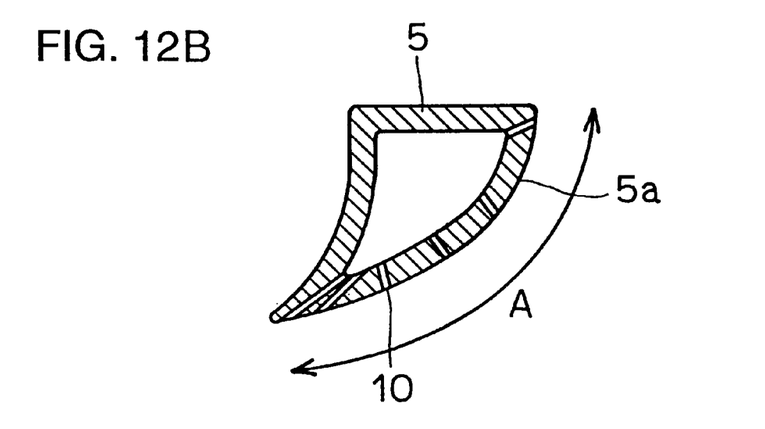

Specifically, as illustrated in FIG. 12, when film sheet 6A is cut by a cutter 3 (see FIG. 14), force for moving the film is applied in the running direction of cutter 3 (in the width direction of film sheet 6A). Therefore, film holding member 5 has to reliably hold film sheet 6A near the cutter backup.

It is therefore preferred that film sucking bores 10 are arranged densely even near cutter backup 4 (see FIG. 1) as illustrated in FIG. 12. Thus, film sheet 6A is reliably held by film holding member 5 and film sheet 6A can be cut without being slipped.

The film disclosed in the above described embodiments is not limited to a photosensitive resist film but other film-type materials having similar properties can also be used.

According to one aspect of the laminator in the present invention, the number of opened film sucking bores is small even if the contact area decreases between a film and the contact surface of the film holding member, and therefore reduction in the negative pressure applied to the film holding member can be suppressed and the film holding portion can have sufficient film sucking bores. As a result, even in laminating the rear end of a film, tensile force of at least a prescribed value is maintained for the film by the film holding member and the laminating operation can be stably performed.

According to another aspect of the laminator in the present invention, the physical resistance force or the substantial sucking area increases for a film. As a result, in laminating the rear end of a film, high tensile force is applied even in the case of the same negative pressure and the same sucking bore arrangement and the laminating operation can be stably performed.

According to still another aspect of the laminator in the present invention, even if the contact area decreases between the film rear end and the contact surface of the film holding member, provision of the groove-like opening which extends across the sending direction of a plate and can be supplied with negative pressure can increase the opening area for film suction in this region. In laminating the rear end of a film, high tensile force is maintained even in the case of the same negative pressure and the laminating operation can be stably performed.

According to yet another aspect of the laminator in the present invention, the film holding member can be placed nearer to the laminate roll when applying a film to a plate compared with a conventional laminator which has a fixed film holding member. Therefore, the film can be stably laminated on the plate till the end of laminating without causing wrinkles and bubbles between the film and the plate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A laminator to apply a film to a plate, comprising:
   a laminate roll to apply said film to said plate; and
   a film holding member arranged near said laminate roll to guide and hold said film till a point of time immediately before applying said film to a surface of said plate and having film sucking bores capable of being supplied with negative pressure in such a surface that is in contact with said film,
   said film sucking bores being arranged more densely near said laminate roll than in other regions.

2. The laminator according to claim 1, wherein said film sucking bores are arranged densely even in a region near a cutter backup which is provided in said laminator.

3. The laminator according to claim 1, wherein said film sucking bores are arranged to be gradually dense toward said laminate roll.

4. The laminator according to claim 1, wherein said film sucking bores are arranged densely near said laminate roll and sparsely in other portions.

5. The laminator according to claim 1, wherein an opening area of each of said film sucking bores becomes gradually larger toward said laminate roll.

6. The laminator according to claim 1, wherein an opening area of each of said film sucking bores is larger near said laminate roll and smaller in other portions.

7. A laminator to apply a film to a plate, comprising:
   a laminate roll to apply said film to said plate; and
   a film holding member arranged near said laminate roll to guide and hold said film till a point of time immediately before applying said film to a surface said plate and having film sucking bores capable of being supplied with negative pressure in such a surface that is in contact with said film,
   an opening area of each of said film sucking bores being larger near said laminate roll than in other regions.

8. The laminator according to claim 7, wherein the opening area of each of said film sucking bores becomes gradually larger toward said laminate roll.

9. The laminator according to claim 7, wherein the opening area of each of said film sucking bores is larger near said laminate roll and smaller in other portions.

10. A laminator to apply a film to a plate, comprising:
    a laminate roll to apply said film to said plate; and
    a film holding member arranged near said laminate roll to guide and hold said film till a point of time immediately before applying said film to a surface of said plate and having film sucking bores capable of being supplied with negative pressure in such a surface that is in contact with said film, said film sucking bores each including a first sucking bore and a second sucking bore which is provided coaxially with and has a larger bore diameter than said first sucking bore, and said second sucking bore being provided on a side of a surface that is in contact with said film.

11. A laminator to apply a film to a plate, comprising:

a laminate roll to apply said film to said plate; and a film holding member arranged near said laminate roll to guide and hold said film till a point of time immediately before applying said film to a surface of said plate and having a film sucking bore or groove capable of being supplied with negative pressure in such a surface that is in contact with said film and a disengaging unit for disengagement from said laminate roll with motion of said laminate roll.

* * * * *